US011442297B2

(12) United States Patent
Merckling

(10) Patent No.: US 11,442,297 B2
(45) Date of Patent: Sep. 13, 2022

(54) PEROVSKITE OXIDES WITH A-AXIS ORIENTATION

(71) Applicant: IMEC VZW, Leuven (BE)

(72) Inventor: Clement Merckling, Evere (BE)

(73) Assignee: IMEC VZW, Leuven (BE)

( * ) Notice: Subject to any disclaimer, the term of this patent is extended or adjusted under 35 U.S.C. 154(b) by 392 days.

(21) Appl. No.: 16/712,732

(22) Filed: Dec. 12, 2019

(65) Prior Publication Data

US 2020/0201085 A1 Jun. 25, 2020

(30) Foreign Application Priority Data

Dec. 20, 2018 (EP) .................................... 18214708

(51) Int. Cl.
| | | |
|---|---|---|
| G02F 1/03 | (2006.01) | |
| C23C 14/08 | (2006.01) | |
| C23C 14/28 | (2006.01) | |
| C30B 23/02 | (2006.01) | |
| C30B 29/32 | (2006.01) | |

(52) U.S. Cl.
CPC .............. *G02F 1/03* (2013.01); *C23C 14/083* (2013.01); *C23C 14/28* (2013.01); *C30B 23/025* (2013.01); *C30B 29/32* (2013.01)

(58) Field of Classification Search
CPC ....... G02F 1/03; C30B 29/32; H01L 41/1871; C23C 14/083; C23C 14/28
See application file for complete search history.

(56) References Cited

U.S. PATENT DOCUMENTS

| | | | |
|---|---|---|---|
| 5,326,721 | A | 7/1994 | Summerfelt |
| 5,393,352 | A | 2/1995 | Summerfelt |
| 2003/0008179 | A1 | 1/2003 | Lee et al. |
| 2015/0023857 | A1* | 1/2015 | Armiento ............ H01L 41/1878 703/2 |
| 2015/0298161 | A1 | 10/2015 | Beeckman et al. |
| 2016/0068990 | A1* | 3/2016 | Spanier ............. C23C 16/45555 117/8 |
| 2021/0275821 | A1* | 9/2021 | Maggard, Jr ............ B01J 23/14 |

FOREIGN PATENT DOCUMENTS

KR 10-0740318 B1 7/2007

OTHER PUBLICATIONS

European Search Report, European Patent Application No. 18214708. 2, dated Jul. 17, 2019, 8 pages.

(Continued)

*Primary Examiner* — Jaehwan Oh
(74) *Attorney, Agent, or Firm* — McDonnell Boehnen Hulbert & Berghoff LLP

(57) ABSTRACT

A structure is provided and includes (i) a substrate having a surface, the surface comprising a ternary or quaternary oxide having a first lattice parameter, the first lattice parameter being a lattice parameter of the ternary or quaternary oxide as it is present at the surface; and (ii) a layer of a perovskite oxide on the ternary or quaternary oxide, the perovskite oxide having a second lattice parameter, the second lattice parameter being a native lattice parameter of the perovskite oxide, wherein the first lattice parameter is larger than the second lattice parameter. A method for forming a perovskite oxide with an a-axis orientation is also provided.

15 Claims, 1 Drawing Sheet

(56) References Cited

OTHER PUBLICATIONS

Watanabe, Takayuki et al., "Controlled Crystal Growth of Layered-Perovskite Thin Films as an Approach to Study Their Basic Properties", Journal of Applied Physics, vol. 100, 051602, 2006, pp. 051602-1-051602-11.

Koo, Junmo et al., "Highly Oriented (Pb, La)TiO3 Thin Films Prepared by Sol-Gel Process", Journal of Materials Science, vol. 34, 1999, pp. 5075-5080.

Hu, Shen et al., "Monolithic Integration of Perovskites on Ge(001) by Atomic Layer Deposition: A Case Study With SrHfxTi1—xO3", MRS Communications, vol. 6, No. 3, 2016, pp. 125-132.

Mcdaniel, Martin D. et al., "Atomic Layer Deposition of Crystalline SrHfO3 Directly on Ge (001) for High-K Dielectric Applications", Journal of Applied Physics, No. 117, 054101, 2015, pp. 054101-1-054101-9.

Rossel, C. et al., "Field-Effect Transistors With SrHfO3 as Gate Oxide", Appl. Phys. Lett., vol. 89, 053506, 2006, pp. 053506-1-053506-3.

Wu, HsinWei et al., "Integration of Ferroelectric BaTiO3 With Ge: The Role of a SrTiO3 Buffer Layer Investigated Using Aberration-Corrected STEM", Appl. Phys. Lett., vol. 110, 252901, 2017, pp. 252901-1-252901-4.

Dubourdieu, Catherine et al., "Switching of Ferroelectric Polarization in Epitaxial BaTiO3 Films on Silicon Without a Conducting Bottom Electrode", Nature Nanotechnology, vol. 8, Oct. 2013, 8 pages.

Moreira, Roberto L. et al., "Comment on Prediction of Lattice Constant in Cubic Perovskites", Journal of Physics and Chemistry of Solids, vol. 68, 2007, pp. 1617-1622.

McKee et al. "Molecular Beam Epitaxy Growth of Epitaxial Barium Silicide, Barium Oxide, and Barium Titanate on Silicon", Applied Physics Letters, vol. 59, No. 7: Aug. 12, 1991, pp. 782-784.

Verma, A. S. et al. "Lattice Constant of Cubic Perovskites", Journal of Alloys and Compounds, vol. 485: 2009, pp. 514-518.

* cited by examiner

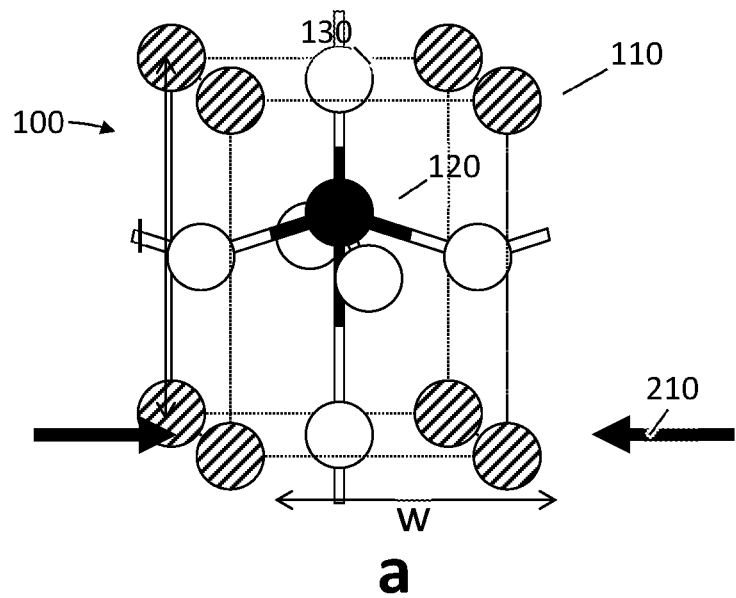
a
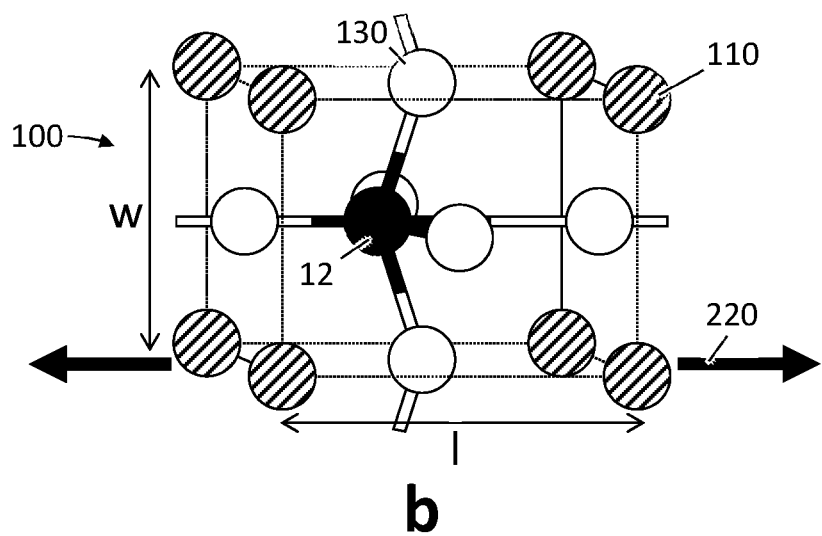
b

PEROVSKITE OXIDES WITH A-AXIS ORIENTATION

CROSS-REFERENCE TO RELATED APPLICATIONS

The present application is a non-provisional patent application claiming priority to European Patent Application No. 18214708.2, filed Dec. 20, 2018, the contents of which are hereby incorporated by reference.

FIELD OF THE DISCLOSURE

The present disclosure relates to perovskite oxides and in particular to perovskite oxides having an a-axis orientation.

BACKGROUND OF THE DISCLOSURE

Transistors technology is progressively evolving from traditional circuit density scaling with the introduction of new materials and new architectures to functional scaling with the disruptive 3D sequential stacking processes, thereby enabling the integration of new functionalities on a chip. In this context, perovskites oxides have a very wide range of interesting intrinsic properties such as a metal-insulator transition, ferroelectricity, pyroelectricity, piezo-electricity, ferromagnetism, and superconductivity.

For the integration of these perovskite oxides, it is of great interest to combine their properties with traditional electronic, memory and optical devices on the same substrate (e.g. a Si-based platform). The challenge to integrate single crystalline perovskites on, for example, Si resides in the thermodynamic stability of the oxide with respect to the Si substrate at high temperature and high oxygen pressure. This was addressed by McKee et al. (MCKEE, R. A., et al. Molecular beam epitaxy growth of epitaxial barium silicide, barium oxide, and barium titanate on silicon. Applied physics letters, 1991, 59.7: 782-784.) by introducing a Sr—O transition layer, so as to enable the epitaxy of strontium titanate ($SrTiO_3$ or STO) on Si(001) by molecular beam epitaxy (MBE). This pioneering work opened the route for the monolithic integration of different perovskite oxides, such as lead zirconate titanate (PZT) and lanthanum strontium manganite (LSMO), on large-scale substrates.

Among these, barium titanate ($BaTiO_3$ or BTO) is still one of the most studied perovskite oxide thin films due to its unique intrinsic properties, such as large and reversible polarization as well as high Pockels coefficients. This makes BTO very attractive for electronic and/or memory devices, such as negative capacitance field-effect transistors (NCFET), ferroelectric field-effect transistors (FeFET), or for optical devices, such as high-speed modulators. Considerable research effort has been directed towards the epitaxy of BTO by various growth techniques on oxide substrates (e.g. $LaAlO_3$ or $SrTiO_3$), group IV substrates (e.g. Ge or Si) and III-V substrates (e.g. GaAs or InP). The principal interest in these studies has been structural defects, including planar defect (e.g. antiphase boundaries), linear defects (e.g. misfits and threading dislocations) and point defects (e.g. oxygen vacancies).

However, another key challenge resides in controlling the orientation of perovskite oxide thin films. Perovskite oxides of interest typically adopt a tetragonal symmetry and the different tetragonal domains may be either oriented in-plane (also referred to as 'a-polarized' or 'a-axis oriented') or out-of-plane (also referred to as 'c-polarized' or 'c-axis oriented'). The desired orientation then depends on the targeted device. For example, for BTO, the a-axis orientation is generally used for optical devices due to the strong Pockels coefficients in this configuration. Conversely, in other devices, the c-axis orientation can be more desired for its ferroelectric effects. There is particularly still a need in the art for methods which can reliably produce good a-axis orientation perovskite oxide layers.

SUMMARY OF THE DISCLOSURE

It is an object of the present disclosure to provide good a-axis oriented perovskite oxide layers. It is a further object of the present disclosure to provide a good method for forming said a-axis oriented perovskite oxide layers. This objective is accomplished by a structure, a method, and a use according to the present disclosure.

In embodiments of the present disclosure, the crystalline orientation of the layers of perovskite oxides can be well controlled.

In embodiments of the present disclosure, the perovskite oxide can be grown epitaxially with respect to the ternary or quaternary oxide.

In embodiments of the present disclosure, the stoichiometry of the perovskite oxide can be well controlled.

In embodiments of the present disclosure, the perovskite oxide can have a low amount of defects or be defect-free.

In embodiments of the present disclosure, the perovskite oxide can be formed on a high-quality ternary or quaternary oxide.

In embodiments of the present disclosure, the method can be performed in a relatively straightforward and economical fashion.

In a first aspect, the present disclosure relates to a structure comprising (i) a substrate having a surface, the surface comprising a ternary or quaternary oxide having a first lattice parameter, the first lattice parameter being a lattice parameter of the ternary or quaternary oxide as it is present at the surface, and (ii) a layer of a perovskite oxide on the ternary or quaternary oxide, the perovskite oxide having an a-axis orientation and having a second lattice parameter, the second lattice parameter being a native lattice parameter of the perovskite oxide; wherein the first lattice parameter is larger than the second lattice parameter. Expressed differently, the first aspect of the present disclosure relates to a structure comprising (i) a substrate having a surface, the surface comprising a ternary or quaternary oxide having a first lattice parameter, the first lattice parameter being a lattice parameter of the ternary or quaternary oxide as it is present at the surface, and (ii) a layer of a perovskite oxide on the ternary or quaternary oxide, the perovskite oxide having an a-axis orientation and being selected from perovskite oxides having a second lattice parameter, being a native lattice parameter, and being smaller than the first lattice parameter.

In a second aspect, the present disclosure relates to a method for forming a perovskite oxide with an a-axis orientation, comprising: (a) providing a substrate having a surface, the surface comprising a ternary or quaternary oxide having a first lattice parameter, the first lattice parameter being a lattice parameter of the ternary or quaternary oxide as it is present at the surface, and (b) depositing a layer of a perovskite oxide on the ternary or quaternary oxide, the perovskite oxide having a second lattice parameter, the second lattice parameter being a native lattice parameter of the perovskite oxide; wherein the first lattice parameter is larger than the second lattice parameter. Expressed differently, the second aspect of the present disclosure relates to a method for forming a perovskite oxide with an a-axis orientation, comprising (a) providing a substrate having a surface, the surface comprising a ternary or quaternary oxide having a first lattice parameter, the first lattice parameter being a lattice parameter of the ternary or quaternary oxide as it is present at the surface, and (b) depositing a layer of a perovskite oxide on the ternary or quaternary oxide, the perovskite oxide being selected from perovskite oxides having a second lattice parameter, being a native lattice parameter, and being smaller than the first lattice parameter.

In a third aspect, the present disclosure relates to the use of a surface comprising a ternary or quaternary oxide, for growing thereon a layer of a perovskite oxide having an a-axis orientation, wherein the ternary or quaternary oxide has a first lattice parameter being a lattice parameter of the ternary or quaternary oxide as it is present at the surface, the perovskite oxide has a second lattice parameter being a native lattice parameter of the perovskite oxide, and the first lattice parameter is larger than the second lattice parameter. Expressed differently, the third aspect of the present disclosure relates to the use of a surface comprising a ternary or quaternary oxide, for growing thereon a layer of a perovskite oxide having an a-axis orientation, wherein the ternary or quaternary oxide has a first lattice parameter being a lattice parameter of the ternary or quaternary oxide as it is present at the surface, wherein the perovskite oxide is selected from perovskite oxides having a second lattice parameter, being a native lattice parameter, and being smaller than the first lattice parameter.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics and features of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE DRAWINGS

FIG. 1 schematically depicts a representative unit cell of a perovskite oxide under (a) compressive and (b) tensile strain.

DETAILED DESCRIPTION OF THE DISCLOSURE

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, on, under and the like in the description and the claims are used for descriptive purposes and not necessarily for describing relative positions. It is to be understood that the terms so used are interchangeable with their antonyms under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various aspects of the disclosure. This disclosed method, however, is not to be interpreted as reflecting an intention that the claimed disclosure requires more features than are expressly recited in each claim. Rather, as the following claims reflect, disclosed aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

The following terms are provided solely to aid in the understanding of the disclosure.

As used herein, and unless otherwise specified, the term 'lattice parameter' can be used interchangeably with the term 'lattice constant'. The term is therefore not used to encompass both lattice constants and lattice angles.

As used herein, and unless otherwise specified, an entity (e.g. a unit cell) is typically characterized by three perpendicular dimensions, of which the longest is herein referred to as the "length" (l) and the shortest as the "width" (w). The third dimension may be equal to the length, equal to the width or may be intermediate between both.

In the case of unit cells, this is can be expressed in term of the lattice parameters a1, a2, and c.

The lattice parameters "a1" and "a2" characterize the dimensions of the crystalline unit cell in a layer parallel to the top surface of that layer, while the lattice parameter c characterizes the dimension out of the plane of the top surface of that layer (e.g. perpendicular thereof).

The parameters "a1" and "a2" refer to the two dimensions of the unit cell parallel to the top surface, independently of their length relative to the out of plane dimension.

a1 can be larger than a2, smaller than a2 or equal to a2. The typical case in the present disclosure will be for a1 to be equal to a2. In that case, both a1 and a2 will be referred to as "a".

In the typical case where a1=a2=a, the parameter "c" may be equal to a (giving a cubic lattice), larger than a (giving a c-axis oriented lattice) or smaller than a (giving a a-axis oriented structure).

The term "length" can refer to either a1, a2, or c, whichever is the longest.

The term "width" can refer to either a1, a2, or c, whichever is the shortest.

As used herein, and unless otherwise specified, a distinction is made between a native lattice parameter, i.e. the relaxed lattice parameter of the material in its unstrained state, and an actual lattice parameter of a material, i.e. the lattice parameter of the material as it is present in the structure of interest (and which may be equal to or different from its intrinsic lattice parameter). Furthermore, it should be appreciated that a material may display different lattice parameters in different directions; unless otherwise indicated, a comparison of lattice parameters between different materials and/or surfaces is always performed on lattice parameters in parallel directions. For example, when a perovskite oxide is epitaxially grown on a ternary or quaternary oxide, the perovskite oxide can typically attempt to adopt an actual lattice parameter, in the directions parallel to its contact area with the ternary or quaternary oxide, equal to the actual lattice parameter of the ternary or quaternary oxide in these directions. Native and actual lattice parameters can, for example, be measured using X-ray, electron or neutron diffraction techniques. Native lattice parameters can also be derived from literature. Verma and Jindal have for example tabulated the lattice parameters of several different ternary, quaternary, and perovskite oxides (VERMA, A. S.; JINDAL, V. K. Lattice constant of cubic perovskites. *Journal of Alloys and Compounds*, 2009, 485.1-2: 514-518.); which is incorporated herein by reference. In particular, the column titled "a(Å) exp. [5]" in tables 1-3 was found to provide useful native lattice parameter values. Similarly, Moreira and Dias have also tabulated the lattice parameters of several different ternary, quaternary, and perovskite oxides (R. L. Moreira, A. Dias, J. of Phys. And Chem. Of solids 68, 2007, 1617-1622); which is incorporated herein by reference. In particular, the column titled "a(Å)" in table 1 was found to provide useful native lattice parameter values.

The perovskite oxide used in the present disclosure can have natively a cubic lattice structure. However, when present in the structure of the present disclosure, they are under tensile stress (they comprise tensile strain), are a-oriented as a result thereof, and hence adopt a tetragonal lattice structure where a>c.

In a first aspect, the present disclosure relates to a structure comprising (i) a substrate having a surface, the surface comprising a ternary or quaternary oxide having a first lattice parameter, the first lattice parameter being a lattice parameter of the ternary or quaternary oxide as it is present at the surface, and (ii) a layer of a perovskite oxide on the ternary or quaternary oxide, the perovskite oxide having a second lattice parameter, the second lattice parameter being a native lattice parameter of the perovskite oxide; wherein the first lattice parameter is larger than the second lattice parameter.

The substrate has a surface comprising a ternary or quaternary oxide. In embodiments, the substrate may be a layer of the ternary or quaternary oxide. This layer may be on a semiconductor substrate. In embodiments, the semiconductor substrate may be a Si or Ge substrate. In embodiments, the semiconductor substrate may be a Si(001) substrate or a Ge(001) substrate. The Si(001) substrate may be a Si substrate having a top surface of Miller indices (001), i.e. having indices h, k, and l equal to 0, 0, and 1, respectively. The Ge(001) substrate may be a Ge substrate having a top surface of Miller indices (001), i.e. having indices h, k, and l equal to 0, 0, and 1, respectively. In embodiments, the ternary or quaternary oxide may be present on a 2×1 reconstructed surface of the semiconductor substrate. A 2×1 reconstructed surface of a semiconductor substrate can be a surface having a unit cell twice as long as that of a non-reconstructed surface of that semiconductor in a first direction (corresponding to a first basic translation vector) but having the same length as that of the non-reconstructed surface in a second direction (corresponding to a second basic translation vector). A Si or Ge substrate having a top surface of Miller indices (001), particularly a 2×1 reconstructed top surface, allows formation of a high quality (e.g. low in defects) ternary or quaternary oxide layer thereon. In embodiments, a buffer layer may be present between the ternary or quaternary oxide and the semiconductor substrate. The buffer layer may facilitate the growth of the ternary or quaternary oxide on the semiconductor substrate.

In embodiments, the semiconductor substrate may be a Si(111) or a Ge(111) substrate. These embodiments can be useful at cryogenic temperatures (−150° C. and below).

The ternary or quaternary oxide can be typically crystalline (e.g. monocrystalline).

In embodiments, the ternary or quaternary oxide may be tetragonal or cubic (e.g. the crystal lattice of the ternary or quaternary oxide may be tetragonal or cubic), usually cubic.

In some embodiments, the unit cell of the ternary or quaternary oxide adopts a cubic structure in its native state (i.e. when unstrained, relaxed). Generally, the ternary or quaternary oxide present in the structure of the first aspect can be unstrained (i.e. it is relaxed, in its native state) and hence its unit cell typically adopts a cubic structure. In that case, it has a single lattice parameter "a" which is the first lattice parameter. This is typically the result of the substrate being grown by a low-temperature epitaxial process. In embodiments, in the case of the ternary or quaternary oxide having a cubic unit cell, the three dimensions are equal (and are hence all equal to the "first lattice parameter a" as referred to herein).

In embodiments, in the case of the ternary or quaternary oxide having a tetragonal unit cell (which can, for instance, be the result of strain in the ternary or quaternary oxide), the lattice structure of the ternary or quaternary oxide can be characterized by the lattice parameters a1, a2, and c.

In the case of a ternary or quaternary oxide layer (also referred herein as the substrate), the lattice parameters a1 and a2 characterize the dimensions of the crystalline unit cell parallel to the top surface of the quaternary oxide layer, while the lattice parameter c characterizes the dimension out of the plane of the top surface of the quaternary oxide layer (e.g. perpendicular thereof).

a1 can be larger than a2, smaller than a2 or equal to a2. The term "length" can refer to either a1, a2, or c, whichever is the longest. The term "width" can refer to either a1, a2, or c, whichever is the shortest. The terms "a1" and "a2" refer to the two dimensions of the unit cell parallel to the top surface of the quaternary oxide layer, independently of their length relative to the out of plane dimension. The term "c" refers to the dimension of the unit cell out of the plane of the top surface of the quaternary oxide layer (e.g. perpendicular thereof), independently of its length relative to the in-plane dimensions.

In embodiments, in the case of the ternary or quaternary oxide having a tetragonal unit cell, the third dimension is generally either equal to the width or equal to the length. In both cases, the third dimension is parallel to the top surface of the substrate and is equal to the second lattice parameter, which is the lattice parameter "a".

In embodiments, the width and the third dimension of the unit cell may be equal to each other (and would be referred herein as the "first lattice parameter") and are parallel to the top surface of the ternary or quaternary oxide, while the length of the unit cell is perpendicular thereof. In other embodiments, the length and the third dimension of the unit cell may be equal to each other (and would be referred herein as the "first lattice parameter") and are parallel to the top surface of the ternary or quaternary oxide, while the width of the unit cell is perpendicular thereof.

In embodiments, in the case of the ternary or quaternary oxide having a tetragonal unit cell where the third dimension is either equal to the width or equal to the length, a1=a2=a and only two lattice parameters are used: a and c.

In embodiments, the ternary or quaternary oxide may at the surface (i.e. the surface of the substrate) be characterized by a unit cell having two perpendicular dimensions parallel to the surface and equal to the first lattice parameter.

As used herein, the first lattice parameter of the ternary or quaternary oxide is a if a1=a2. In embodiments, when the ternary or quaternary oxide is characterized by a plurality of native lattice parameters which are not equal in size (which is a less desirable embodiment), the first lattice parameter may be taken as the largest of these native lattice parameters parallel to the top surface of the substrate.

The ternary or quaternary oxide may in some embodiment be a perovskite oxide. This terminology is however not used herein to qualify the ternary or quaternary oxide in order not to confuse the ternary or quaternary oxide with the layer of a perovskite oxide provided thereon.

In embodiments, the ternary oxide may have a general chemical formula $ABO_3$ (e.g. $A^{2+}B^{4+}O_3$) wherein A may be selected from the group consisting of Ba, Sr and Ca; and B may be selected from the group consisting of Ti, Zr, and Hf. In embodiments, the ternary oxide may not be $BaTiO_3$ (BTO). BTO may be a usual material for the perovskite oxide and it may, in some embodiments, therefore be desirable in that role rather than as a ternary oxide.

In embodiments, the quaternary oxide may have a general chemical formula $AB_xB'_{1-x}O_3$ (e.g. $A^{2+}B^{4+}_xB'^{4+}_{1-x}O_3$); wherein $0<x<1$; A may be selected from the group consisting of Ba, Sr and Ca; B may be selected from the list consisting of Ti, Zr, and Hf; and B' may be selected from the list consisting of Ti, Zr, and Hf and differs from B. In some embodiments, B may be Zr or Hf and B' may be Ti. In embodiments, x may be selected in such a way that the first lattice parameter can be larger than the second lattice parameter. Indeed, since the lattice parameter for quaternary oxides typically changes in function of the value of x, this value can be for some combinations of quaternary oxides and perovskite oxides determine whether the first lattice parameter is larger, smaller or equal to the second lattice parameter. This can particularly be the case when, compared to the second lattice parameter, the first lattice parameter is smaller for x=0 (i.e. for the ternary oxide $AB'O_3$ which marks one end of the distribution) and larger for x=1 (i.e. for the ternary oxide $ABO_3$ which marks the other end of the distribution), or vice versa. In that case, a transition from larger to smaller or smaller to larger can typically occur for some intermediate value of x; this transition point can be calculated or determined experimentally without undue burden (as is for instance illustrated in example 1). Depending on whether the transition is from smaller to larger or larger to smaller for increasing x, selecting x in such a way that the first lattice parameter is larger than the second lattice parameter then simply amounts to respectively selecting a value larger or smaller than the transition point. Additionally, x is generally selected relatively close to said transition point (e.g. within 3.0%, or within 1.5%, or within 1.0%), so as to keep the difference between the first and the second lattice constant relatively small and thereby obtain a relatively defect-free perovskite oxide.

In embodiments, the ternary oxide may be $SrTiO_3$, and the perovskite oxide may be sodium tantalate.

In embodiments, the ternary oxide may be $CaHfO_3$, and the perovskite oxide may be selected from potassium tantalate, sodium niobate, and sodium tantalate.

In embodiments, the ternary oxide may be $SrHfO_3$, and the perovskite oxide may be selected from barium titanate, lead zirconate titanate, potassium niobate, potassium tantalate, potassium tantalate niobite, sodium niobate, and sodium tantalate.

In embodiments, the ternary oxide may be $BaHfO_3$, and the perovskite oxide may be selected from barium titanate, lead zirconate titanate, potassium niobate, potassium tantalate, potassium tantalate niobite, sodium niobate, and sodium tantalate.

In embodiments, the ternary oxide may be $CaZrO_3$, and the perovskite oxide may be selected from barium titanate, lead zirconate titanate, potassium niobate, potassium tantalate, potassium tantalate niobite, sodium niobate, and sodium tantalate.

In embodiments, the ternary oxide may be $SrZrO_3$, and the perovskite oxide may be selected from barium titanate, lead zirconate titanate, potassium niobate, potassium tantalate, potassium tantalate niobite, sodium niobate, and sodium tantalate.

In embodiments, the ternary oxide may be BaZrO$_3$, and the perovskite oxide may be selected from barium titanate, lead zirconate titanate, potassium niobate, potassium tantalate, potassium tantalate niobite, sodium niobate, and sodium tantalate.

In embodiments, the quaternary oxide may be CaHf$_x$Ti$_{1-x}$O$_3$, the perovskite oxide may be KTaO$_3$ and x≥0.76 (e.g. 0.76≤x≤0.99); usually x>0.76 (e.g. 0.76<x<1).

In embodiments, the quaternary oxide may be CaHfxTi1-xO3, the perovskite oxide may be KTa$_{0.5}$Nb$_{0.5}$O$_3$ and x≥0.81 (e.g. 0.81≤x≤0.99); usually x>0.81 (e.g. 0.81<x<1).

In embodiments, the quaternary oxide may be CaHf$_x$Ti$_{1-x}$O$_3$, the perovskite oxide may be NaNbO$_3$ and x≥0.66 (e.g. 0.66≤x≤0.99); usually x>0.66 (e.g. 0.66<x<1).

In embodiments, the quaternary oxide may be CaHf$_x$Ti$_{1-x}$O$_3$, the perovskite oxide may be NaTaO$_3$ and x≥0.21 (e.g. 0.21≤x≤0.99); usually x>0.21 (e.g. 0.21<x<1).

In embodiments, the quaternary oxide may be SrHf$_x$Ti$_{1-x}$O$_3$, the perovskite oxide may be BaTiO$_3$ and x≥0.53 (e.g. 0.53≤x≤0.99); usually x>0.53 (e.g. 0.53<x<1).

In embodiments, the quaternary oxide may be SrHf$_x$Ti$_{1-x}$O$_3$, the perovskite oxide may be PbZr0.5Ti$_{0.5}$O$_3$ and x≥0.59 (e.g. 0.59≤x≤0.99); usually x>0.59 (e.g. 0.59<x<1).

In embodiments, the quaternary oxide may be SrHf$_x$Ti$_{1-x}$O$_3$, the perovskite oxide may be KNbO$_3$ and x≥0.62 (e.g. 0.62≤x≤0.99); usually x>0.62 (e.g. 0.62<x<1).

In embodiments, the quaternary oxide may be SrHf$_x$Ti$_{1-x}$O$_3$, the perovskite oxide may be KTaO$_3$ and x≥0.51 (e.g. 0.51≤x≤0.99); usually x>0.51 (e.g. 0.51<x<1).

In embodiments, the quaternary oxide may be SrHf$_x$Ti$_{1-x}$O$_3$, the perovskite oxide may be KTa$_{0.5}$Nb$_{0.5}$O$_3$ and x≥0.56 (e.g. 0.56≤x≤0.99); usually x>0.56 (e.g. 0.56<x<1).

In embodiments, the quaternary oxide may be SrHf$_x$Ti1-xO3, the perovskite oxide may be NaNbO$_3$ and x≥0.39 (e.g. 0.39≤x≤0.99); usually x>0.39 (e.g. 0.39<x<1).

In embodiments, the quaternary oxide may be SrHf$_x$Ti$_{1-x}$O$_3$, the perovskite oxide may be NaTaO$_3$ and x≥0 (e.g. 0≤x≤0.99); usually x>0 (e.g. 0<x <1).

In embodiments, the quaternary oxide may be BaHf$_x$Ti$_{1-x}$O$_3$, the perovskite oxide may be BaTiO$_3$ and x≥0 (e.g. 0≤x≤0.99); usually x>0 (e.g. 0<x<1).

In embodiments, the quaternary oxide may be BaHf$_x$Ti$_{1-x}$O$_3$, the perovskite oxide may be PbZr$_{0.5}$Ti$_{0.5}$O$_3$ and x≥0 (e.g. 0≤x≤0.99); usually x>0 (e.g. 0<x<1).

In embodiments, the quaternary oxide may be BaHf$_x$Ti$_{1-x}$O$_3$, the perovskite oxide may be KNbO$_3$ and x≥0 (e.g. 0≤x≤0.99); usually x>0 (e.g. 0<x<1).

In embodiments, the quaternary oxide may be BaHf$_x$Ti$_{1-x}$O$_3$, the perovskite oxide may be KTaO$_3$ and x≥0 (e.g. 0≤x≤0.99); usually x>0 (e.g. 0<x<1).

In embodiments, the quaternary oxide may be BaHf$_x$Ti$_{1-x}$O$_3$, the perovskite oxide may be KTa$_{0.5}$Nb$_{0.5}$O$_3$ and x≥0.03 (e.g. 0.03≤x≤0.99); usually x>0.03 (e.g. 0.03<x<1).

In embodiments, the quaternary oxide may be BaHf$_x$Ti$_{i-x}$O$_3$, the perovskite oxide may be NaNbO$_3$ and x≥0 (e.g. 0≤x≤0.99); usually x>0 (e.g. 0<x<1).

In embodiments, the quaternary oxide may be BaHf$_x$Ti$_{1-x}$O$_3$, the perovskite oxide may be NaTaO$_3$ and x≥0 (e.g. 0≤x≤0.99); usually x>0 (e.g. 0<x<1).

In embodiments, the quaternary oxide may be CaZr$_x$Ti$_{1-x}$O$_3$, the perovskite oxide may be BaTiO$_3$ and x≥0.92 (e.g. 0.92≤x≤0.99); usually x>0.92 (e.g. 0.92<x<1).

In embodiments, the quaternary oxide may be CaZr$_x$Ti$_{1-x}$O$_3$, the perovskite oxide may be PbZr$_{0.5}$Ti$_{0.5}$O$_3$ and x≥0.75 (e.g. 0.75≤x≤0.99); usually x>0.75 (e.g. 0.75<x<1).

In embodiments, the quaternary oxide may be CaZr$_x$Ti$_{1-x}$O$_3$, the perovskite oxide may be KNbO$_3$ and x≥0.78 (e.g. 0.78≤x≤0.99); usually x>0.78 (e.g. 0.78<x<1).

In embodiments, the quaternary oxide may be CaZr$_x$Ti$_{1-x}$O$_3$, the perovskite oxide may be KTaO$_3$ and x≥0.69 (e.g. 0.69≤x≤0.99); usually x>0.69 (e.g. 0.69<x<1).

In embodiments, the quaternary oxide may be CaZr$_x$Ti$_{1-x}$O$_3$, the perovskite oxide may be KTa$_{0.5}$Nb$_{0.5}$O$_3$ and x≥0.73 (e.g. 0.73≤x≤0.99); usually x>0.73 (e.g. 0.73<x<1).

In embodiments, the quaternary oxide may be CaZr$_x$Ti$_{1-x}$O$_3$, the perovskite oxide may be NaNbO$_3$ and x≥0.60 (e.g. 0.60≤x≤0.99); usually x>0.60 (e.g. 0.60<x<1).

In embodiments, the quaternary oxide may be CaZr$_x$Ti$_{1-x}$O$_3$, the perovskite oxide may be NaTaO$_3$ and x≥0.19 (e.g. 0.19≤x≤0.99); usually x>0.19 (e.g. 0.19<x<1).

In embodiments, the quaternary oxide may be SrZr$_x$Ti$_{1-x}$O$_3$, the perovskite oxide may be BaTiO$_3$ and x≥0.44 (e.g. 0.44≤x≤0.99); usually x>0.44 (e.g. 0.44<x<1).

In embodiments, the quaternary oxide may be SrZrxTi$_{1-x}$O$_3$, the perovskite oxide may be PbZr$_{0.5}$Ti$_{0.5}$O$_3$ and x≥0.59 (e.g. 0.59≤x≤0.99); usually x>0.59 (e.g. 0.59<x<1).

In embodiments, the quaternary oxide may be SrZr$_x$Ti$_{1-x}$O$_3$, the perovskite oxide may be KNbO$_3$ and x≥0.51 (e.g. 0.51≤x≤0.99); usually x>0.51 (e.g. 0.51<x<1).

In embodiments, the quaternary oxide may be SrZr$_x$Ti$_{1-x}$O$_3$, the perovskite oxide may be KTaO$_3$ and x≥0.42 (e.g. 0.42≤x≤0.99); usually x>0.42 (e.g. 0.42<x<1).

In embodiments, the quaternary oxide may be SrZr$_x$Ti$_{1-x}$O$_3$, the perovskite oxide may be KTa$_{0.5}$Nb$_{0.5}$O$_3$ and x≥0.46 (e.g. 0.46≤x≤0.99); usually x>0.46 (e.g. 0.46<x<1).

In embodiments, the quaternary oxide may be SrZr$_x$Ti$_{1-x}$O$_3$, the perovskite oxide may be NaNbO$_3$ and x≥0.32 (e.g. 0.32≤x≤0.32); usually x>0.32 (e.g. 0.32<x<1).

In embodiments, the quaternary oxide may be SrZr$_x$Ti$_{1-x}$O$_3$, the perovskite oxide may be NaTaO$_3$ and x≥0 (e.g. 0≤x≤0.99); usually x>0 (e.g. 0<x<1).

In embodiments, the ternary oxide may be BaZr$_x$Ti$_{1-x}$O$_3$, and the perovskite oxide may be selected from barium titanate, lead zirconate titanate, potassium niobate, potassium tantalate, sodium niobate, and sodium tantalate.

In embodiments, the quaternary oxide may be BaZr$_x$Ti$_{1-x}$O$_3$, the perovskite oxide may be KTa$_{0.5}$Nb$_{0.5}$O$_3$and x≥0.03 (e.g. 0.03≤x≤0.99); usually x>0.03 (e.g. 0.03<x<1).

In some embodiments, the quaternary oxide may be SrHf$_x$Ti$_{1-x}$O$_3$, the perovskite oxide may be BaTiO$_3$ and x≥0.53 (e.g. 0.53≤x≤0.70); usually x>0.53 (e.g. 0.53<x<0.70).

In embodiments, the ternary or quaternary oxide may have a top surface of Miller indices (001), i.e. having indices h, k, and l equal to 0, 0, and 1, respectively. Generally, the semiconductor substrate may be a Si(001) substrate or a Ge(001) substrate and the ternary or quaternary oxide may have a top surface of Miller indices (001).

The ternary or quaternary oxide and the perovskite oxide are different materials.

The perovskite oxide can be typically crystalline (e.g. monocrystalline). In embodiments, the perovskite oxide may have a top surface of Miller indices (001), i.e. having indices h, k, and l equal to 0, 0, and 1, respectively. Generally, the semiconductor substrate may be a Si(001) substrate or a Ge(001) substrate, the ternary or quaternary oxide may have a top surface of Miller indices (001), and the perovskite oxide may have a top surface of Miller indices (001). (001) surfaces can be desirable because they offer the most reliable out of plane and in-plane control of the perovskite polarization.

In embodiments, in the case of the perovskite oxide having a tetragonal unit cell and being a-axis oriented, the length and the third dimension of the unit cell are usually equal and are parallel to the top surface of the perovskite oxide (and are referred herein as the second lattice parameter a), while the width of the unit cell is perpendicular thereof and correspond to the lattice parameter c.

The first lattice parameter is in the plane of the substrate surface. If the ternary or quaternary oxide is strained, the first lattice parameter is the actual lattice parameter a (or if a1 is different from a2, the largest of a1 and a2) of the ternary or quaternary oxide as it is present at the surface and it must be measured. More typically, the ternary or quaternary oxide is unstrained and the first lattice parameter as it is present at the surface is the native lattice parameter a.

The second lattice parameter is the lattice parameter of the native perovskite oxide (which is typically cubic and hence has typically a single lattice parameter a).

The second lattice parameter refers to the lattice parameter measured in the relaxed (unstrained) perovskite oxide material when it does not form part of the structure of the present disclosure. It does not refer to its lattice parameter as it is present in the structure of the present disclosure. Hence, when it is said that the second lattice parameter is a native lattice parameter of the perovskite oxide, this does not mean that the perovskite oxide, as it is present in the structure of the present disclosure, adopts this native lattice parameter. The perovskite oxide in the structure of the present disclosure being strained, its actual lattice parameter is not equal to its native parameter. What it means is that the perovskite oxide of the layer may be selected from perovskite oxides known for having in their native state a lattice parameter smaller than the first lattice parameter.

In embodiments, the first lattice parameter is the in-plane parameter 'a' of the ternary or quaternary oxide and the second lattice parameter is the in-plane parameter 'a' of the perovskite. Typically, the first lattice parameter is the single parameter 'a' of the cubic ternary or quaternary oxide (the three in-plane lattice parameters of the cubic ternary or quaternary oxide being equal) and the second lattice parameter is the in-plane parameter 'a' of the native cubic perovskite oxide (the two in-plane lattice parameters of the cubic perovskite being equal).

As a result of the difference between the first and the second lattice parameter, said layer of a perovskite oxide typically has an a-axis orientation, i.e. its crystal structure is a-polarized (or a-oriented).

As a result of the difference in lattice parameters, said layer of a perovskite oxide can typically be under tensile strain.

It was surprisingly realized within the present disclosure that stress on a perovskite oxide can be used to induce a crystalline orientation therein. This is schematically depicted in FIG. 1. In FIG. 1, part a, a representative unit cell (100) of a perovskite oxide $MNO_3$ under compressive stress (210) is shown; wherein M is a first metal ion (110), N is a second metal ion (120) and O is an oxygen ion (130). The most stable orientation for the perovskite oxide unit cell can be where its width (w) is parallel to the compressive stress direction and its length (l) is perpendicular to said direction. It was determined that, when growing a perovskite oxide on a ternary or quaternary oxide surface having a first (i.e. actual) lattice parameter which is smaller than the second (i.e. native) lattice parameter of the perovskite oxide, as is for example the case when barium titanate (BTO) is grown on strontium titanate (STO), the perovskite oxide experiences compressive strain parallel to the surface and its c-axis orientation is promoted. Though it is known in the art to grow BTO on STO to obtain a c-axis orientation, the fact that this orientation can be driven by the lattice parameters was hesreto not yet appreciated.

Conversely, in FIG. 1, part b, a representative unit cell (100) of a perovskite oxide $MNO_3$ under tensile stress (220) is shown. The most stable crystalline orientation for the perovskite oxide unit cell can be where its length (l) is parallel to the tensile stress direction and its width (w) is perpendicular to said direction. As such, it was found for the first time that the formation of an a-axis oriented perovskite oxide can be promoted by growing it on a ternary or quaternary oxide surface having a first (i.e. actual) lattice parameter which can be larger than the second (i.e. native) lattice parameter of the perovskite oxide. In this case, the perovskite oxide experiences tensile strain parallel to the surface and the a-axis orientation can be promoted.

In embodiments, when the perovskite oxide can be characterized by a plurality of native lattice parameters which are not equal in size, the second lattice parameter may be taken as the largest of these native lattice parameters. However, the perovskite oxides usable in the structure of the present disclosure being typically cubic in their native state, they typically have a single native lattice parameter. In embodiments, the first lattice parameter may be from 0.05% to 3% larger than the second lattice parameter, usually from 0.1% to 1.5% larger; such as from 0.1 to 1.0% larger. This can be calculated by subtracting the second lattice parameter from the first lattice parameter, then dividing this difference by the second lattice parameter, and finally multiplying this quotient by 100%. When the difference between the first lattice parameter and the second lattice parameter is too big, the obtained perovskite oxide typically displays several defects in its crystal structure. As such, the first lattice parameter may be only slightly larger than the second lattice parameter, thereby allowing a relatively defect-free a-axis oriented perovskite oxide.

In some embodiments, the perovskite oxide as it is present in the structure may be a tetragonal perovskite oxide (i.e. a perovskite oxide having a tetragonal crystalline structure). In embodiments, the layer of the perovskite oxide may be an electro-optical layer. In embodiments, the electro-optical layer may be a layer which can display an electro-optic effect (i.e. a change in its optical properties in response to an electrical field). In embodiments, the perovskite oxide may be selected from the list consisting of $BaTiO_3$, $PbZr_yTi_{1-y}O$ wherein $0 \leq y \leq 1$, an alloy of $BaTiO_3$, an alloy of $PbZr_yTi_{1-y}O$ and $(K,Na,Li)(Ta,Nb)O_3$. In some embodiments, the $(K,Na,Li)(Ta,Nb)O_3$ may be a compound with general chemical formula $MNO_3$, wherein M may be one or more elements independently selected from the group of K, Na, and Li, and N may be one or more elements independently selected from the group of Ta and Nb. In the case where M is more than one element, the sum of the number of K, Na, and Li ions in the general formula can be equal to ⅓ of the sum of the number of oxygen ions in the formula. Similarly, when N is more than one element, the sum of the number of Ta and Nb ions in the general formula can be equal to ⅓ of the sum of the number of oxygen ions in the formula. Expressed, differently, $(K,Na,Li)(Ta,Nb)O_3$ may be expressed as $K_mNa_nLi_oTa_xNb_yO_3$ wherein $m+n+o=1$ and $x+y=1$. In other embodiments, the $(K,Na,Li)(Ta,Nb)O_3$ may be a compound with general chemical formula $MNO_3$, wherein M may be selected from the group of K, Na and Li, and N may be selected from the list of Ta and Nb. In embodiments, the layer of perovskite oxide may have a thickness ranging between 1 nm and 50 nm, usually ranging between 2 nm and 20 nm. The influence of the underlayer (i.e. the ternary or quaternary oxide) on the orientation of the perovskite oxide may in some embodiments decrease with increasing perovskite oxide layer thickness; the perovskite oxide layer thickness may therefore be relatively thin.

In some embodiments, the semiconductor substrate may be the Si(001) substrate, the quaternary oxide may be $SrHf_xTi_{1-x}O_3$ with $0.53 \leq x \leq 0.70$ (e.g. $0.53 < x < 0.70$) and the perovskite oxide may be $BaTiO_3$. In other embodiments, the semiconductor substrate may be the Ge(001) substrate, the ternary oxide may be $BaZrO_3$ and the perovskite oxide may be $BaTiO_3$.

In embodiments, any feature of any embodiment of the first aspect may independently be as correspondingly described for any embodiment of any of the other aspects.

In a second aspect, the present disclosure relates to a method for forming a perovskite oxide with an a-axis orientation, comprising: (a) providing a substrate having a surface, the surface comprising a ternary or quaternary oxide having a first lattice parameter, the first lattice parameter being a lattice parameter of the ternary or quaternary oxide as it is present at the surface, and (b) depositing a layer of a perovskite oxide on the ternary or quaternary oxide, the perovskite oxide having a second lattice parameter, the second lattice parameter being a native lattice parameter of the perovskite oxide; wherein the first lattice parameter is larger than the second lattice parameter.

In embodiments, step a may comprise depositing a layer of the ternary or quaternary oxide on a semiconductor substrate by molecular beam epitaxy (MBE). In embodiments, step a may be performed at a temperature ranging between 200 and 650° C. For example, an initial layer (e.g. half a monolayer) of a metal ion may first be deposited on the semiconductor substrate at a temperature ranging between 450 and 650° C., and the layer of the ternary or quaternary oxide may subsequently be deposited thereon at a temperature ranging between 200 and 400° C.

In embodiments, depositing a layer of the ternary or quaternary oxide on a semiconductor substrate may comprise depositing the layer of ternary or quaternary oxide on a 2×1 reconstructed surface of a Si(001) or Ge(001) substrate. In embodiments, the 2×1 reconstructed surface may be preserved during step a.

In embodiments, step b of depositing the layer of perovskite oxide on the ternary or quaternary oxide may comprise epitaxially growing the layer of perovskite oxide on the ternary or quaternary oxide. In embodiments, step b may be performed by molecular beam epitaxy (MBE) or pulsed laser deposition (PLD). PLD may be used as it allows (compared to MBE) to better control the stoichiometry of the perovskite oxide and leads to fewer oxygen vacancies due to a higher $O_2$ pressure during growth. In embodiments, step b may be performed at a temperature ranging between 550 and 750° C.

In embodiments, any feature of any embodiment of the second aspect may independently be as correspondingly described for any embodiment of any of the other aspects.

In a third aspect, the present disclosure relates to a use of a surface comprising a ternary or quaternary oxide, for growing thereon a layer of a perovskite oxide having an a-axis orientation; wherein the ternary or quaternary oxide has a first lattice parameter being a lattice parameter of the ternary or quaternary oxide as it is present at the surface, the perovskite oxide has a second lattice parameter being a native lattice parameter of the perovskite oxide and the first lattice parameter is larger than the second lattice parameter.

In embodiments, any feature of any embodiment of the third aspect may independently be as correspondingly described for any embodiment of any of the other aspects.

The disclosure will now be described by a detailed description of several embodiments of the disclosure. It is clear that other embodiments of the disclosure can be configured according to the knowledge of the person skilled in the art without departing from the true technical teaching of the disclosure, the disclosure being limited only by the terms of the appended claims.

Example 1: Combinations of Perovskite Oxide and Ternary or Quaternary Oxide

By comparing the first lattice parameter of ternary or quaternary oxide with the second lattice parameter of the perovskite oxide, one can derive whether for the perovskite oxide an a-axis or c-axis orientation is promoted. This exercise was performed for several combinations of perovskite oxides with ternary or quaternary oxides; the results of which are listed in the table below. Herein, 'c' marks that a c-axis orientation can be obtained (i.e. for any value of x in the case of a quaternary oxide), 'a' marks that an a-axis orientation can be obtained (i.e. for any value of x in the case of a quaternary oxide) and a number expresses the transition point for x at which the quaternary oxide transitions from promoting a c-axis orientation to an a-axis orientation. In the latter case, a value for x above the one listed then typically yields an a-axis orientation for the corresponding perovskite oxide; and vice versa.

In order to illustrate the determination of this transition point, one can for instance consider the situation of $BaTiO_3$ (BTO) on $SrHf_xTi_{1-x}O_3$: by interpolating between the lattice constant for the ternary oxide corresponding to x=0 (i.e. $SrTiO_3$) on the one hand and the lattice constant for the ternary oxide corresponding to x=1 (i.e. $SrHfO_3$) on the other hand, it was found that the first lattice constant (i.e. $SrHf_xTi_{1-x}O_3$) can be equal to the second lattice constant (i.e. of $BaTiO_3$) for x=0.53.

In some cases, the results can hinge on the specific values that are used for the lattice parameters. While the values used herein were obtained or calculated from lattice parameter values available in the literature (e.g. Moreira and Dias (2007), cf. supra), there may be slight differences between different sources or different measurement techniques. While these differences are typically small, they may nevertheless lead to differing outcomes. The results listed in the table below are therefore to be interpreted as a first indication, based on which suitable combinations of ternary or quaternary oxides and perovskite oxides can then be found with minor trial-and-error.

|  | BTO | PZT | KNO | KTO | KTN | NNO | NTO |
|---|---|---|---|---|---|---|---|
| $CaTiO_3$ | c | c | c | c | c | c | c |
| $SrTiO_3$ | c | c | c | c | c | c | a |
| $CaHfO_3$ | c | c | c | a | c | a | a |
| $SrHfO_3$ | a | a | a | a | a | a | a |
| $BaHfO_3$ | a | a | a | a | a | a | a |
| $CaZrO_3$ | a | a | a | a | a | a | a |
| $SrZrO_3$ | a | a | a | a | a | a | a |
| $BaZrO_3$ | a | a | a | a | a | a | a |
| $CaHf_xTi_{1-x}O_3$ | c | c | c | 0.76 | 0.81 | 0.66 | 0.21 |
| $SrHf_xTi_{1-x}O_3$ | 0.53 | 0.59 | 0.62 | 0.51 | 0.56 | 0.39 | a |
| $BaHf_xTi_{1-x}O_3$ | a | a | a | a | 0.03 | a | a |

| | BTO | PZT | KNO | KTO | KTN | NNO | NTO |
|---|---|---|---|---|---|---|---|
| $CaZr_xTi_{1-x}O_3$ | 0.92 | 0.75 | 0.78 | 0.69 | 0.73 | 0.60 | 0.19 |
| $SrZr_xTi_{1-x}O_3$ | 0.44 | 0.59 | 0.51 | 0.42 | 0.46 | 0.32 | a |
| $BaZr_xTi_{1-x}O_3$ | a | a | a | a | 0.03 | a | a |

Wherein the abbreviations used for the perovskite oxides are as follows: BTO is barium titanate ($BaTiO_3$), PZT is lead zirconate titanate ($PbZr_{0.5}Ti_{0.5}O_3$), KNO is potassium niobate ($KNbO_3$), KTO is potassium tantalate ($KTaO_3$), KTN is potassium tantalate niobate ($KTa_{0.5}Nb_{0.5}O_3$), NNO is sodium niobate ($NaNbO_3$) and NTO is sodium tantalate ($NaTaO_3$).

While it is shown in the table above that for $CaTiO_3$ a c-axis orientation is obtained for each of the listed perovskite oxides, it will be clear that this need to be strictly so for every perovskite oxide. Indeed, it can be expected that $CaTiO_3$ will nevertheless promote an a-axis orientation in combination with a perovskite oxide which was not investigated in this example.

Example 2: Formation of a Perovskite Oxide with an A-Axis Orientation

Example 2a: $BaTiO_3$ on a $SrHf_xTi_{1-x}O_3/Si(001)$ Substrate

A Si(001) semiconductor substrate is first cleaned with HF and then introduced into a molecular beam epitaxy (MBE) chamber. A baking of the Si(001) is performed to obtain a 2×1 reconstructed surface.

Half a monolayer of Sr is then deposited on the Si at a temperature between 450 and 65° C., thereby preserving the 2×1 reconstructed surface. A 2-20 nm thick layer of a $SrHf_xTi_{1-x}O_3$ quaternary oxide (with $0.53<x<0.7$) is subsequently grown thereon at a temperature between 200 and 400° C.

Finally, a $BaTiO_3$ perovskite oxide layer is formed in situ (i.e. by MBE) at a temperature between 550 and 750° C. Alternatively, the $BaTiO_3$ perovskite oxide layer can be formed ex situ (i.e. after removing the substrate with the quaternary oxide layer from the MBE chamber) using pulsed laser deposition (PLD).

Example 2b: $BaTiO_3$ on a $BaTiO_3/Ge(001)$ Substrate

A Ge(001) semiconductor substrate is first cleaned with HF and then introduced into a molecular beam epitaxy (MBE) chamber. A baking of the Ge(001) is performed to obtain a 2×1 reconstructed surface.

Half a monolayer of Ba is then deposited on the Ge at a temperature between 450 and 650° C., thereby preserving the 2×1 reconstructed surface. A 2-20 nm thick layer of a $BaZrO_3$ ternary oxide is subsequently grown thereon at a temperature between 200 and 400° C.

Finally, a $BaTiO_3$ perovskite oxide layer is formed in situ (i.e. by MBE) at a temperature between 550 and 750° C. Alternatively, the $BaTiO_3$ perovskite oxide layer can be formed ex situ (i.e. after removing the substrate with the quaternary oxide layer from the MBE chamber) using pulsed laser deposition (PLD).

Example 2c: Other Combinations of Perovskite Oxide and Substrate

The procedure as outlined in example 2a and example 2b can be adapted to grow an arbitrary perovskite oxide on an arbitrary ternary or quaternary oxide. An a-axis oriented perovskite oxide layer can thereby be obtained (provided that the first lattice parameter of the ternary or quaternary oxide is larger than the second lattice parameter of the perovskite oxide layer). Several possible combinations can be derived from the table of example 1.

It is to be understood that although various embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

The invention claimed is:

1. A structure comprising:
    (i) a layer of a monocrystalline ternary or quaternary oxide on a Si(001) substrate or a Ge(001) substrate, the layer having a surface, the surface comprising a monocrystalline ternary or quaternary oxide having a crystalline unit cell having two perpendicular dimensions parallel to the surface and equal to a first lattice parameter, the first lattice parameter being a lattice parameter of the monocrystalline ternary or quaternary oxide as it is present at the surface; and
    (ii) a tensile strained layer of a monocrystalline perovskite oxide on the ternary or quaternary oxide, the monocrystalline perovskite oxide having in its tensile strained state a tetragonal crystalline unit cell characterized by lattice parameters a and c, wherein a refers to the dimension of the unit cell parallel to the top surface of the layer, wherein c refers to the dimension of the unit cell out of the plane of the top surface of the layer, wherein c is smaller than a, thereby giving an a-axis orientation to the tensile strained layer, and being selected from perovskite oxides having an in-plane second lattice parameter, being a native lattice parameter, and being smaller than the first lattice parameter.

2. The structure according to claim 1, wherein the first lattice parameter is from 0.05% to 3% larger than the second lattice parameter.

3. The structure according to claim 1, wherein the first lattice parameter is from 0.1% to 1.5% larger than the second lattice parameter.

4. The structure according to claim 1, wherein the ternary oxide has a general chemical formula $ABO_3$ wherein A is selected from the group consisting of Ba, Sr, and Ca, and B is selected from the group consisting of Ti, Zr, and Hf.

5. The structure according to claim 1, wherein the quaternary oxide has a general chemical formula $AB_xB'_{1-x}O_3$ wherein $0<x<1$, A is selected from the group consisting of Ba, Sr, and Ca, B is selected from the group consisting of Ti, Zr, and Hf, and B' is selected from the group consisting of Ti, Zr, and Hf and differs from B.

6. The structure according to claim 5, wherein x is selected in such a way that the first lattice parameter is larger than the second lattice parameter.

7. The structure according to claim 1, wherein the perovskite oxide is selected from the group consisting of $BaTiO_3$, $PbZr_yTi_{1-y}O$ wherein $0\le y\le 1$, and an alloy of $BaTiO_3$ or $PbZr_yTi_{1-y}O$ and $(K,Na,Li)(Ta,Nb)O_3$.

8. The structure according to claim 1, wherein the semiconductor substrate is the Si(001) substrate, the quaternary oxide is $SrHf_xTi_{1-x}O_3$ with $0.53\le x\le 0.7$ and the perovskite oxide is $BaTiO_3$.

9. The structure according to claim 1, wherein the semiconductor substrate is the Ge(001) substrate, the ternary oxide is $BaZrO_3$ and the perovskite oxide is $BaTiO_3$.

10. The structure according to claim 1, wherein the layer of perovskite oxide has a thickness ranging between 1 nm and 50 nm.

11. The structure according to claim 1, wherein the layer of perovskite oxide has a thickness ranging between 2 nm and 20 nm.

12. A method for forming a tensile strained monocrystalline perovskite oxide layer having in its tensile strained state a tetragonal crystalline unit cell having lattice parameters a and c, wherein a refers to the dimension of the unit cell parallel to the top surface of the layer, wherein c refers to the dimension of the unit cell out of the plane of the top surface of the layer, wherein c is smaller than a thereby giving an a-axis orientation to the tensile strained perovskite oxide layer, the method comprising:

(a) providing a layer of a monocrystalline ternary or quaternary oxide on a Si(001) substrate or a Ge(001) substrate, the layer having a surface, the surface comprising a monocrystalline ternary or quaternary oxide having a crystalline unit cell having two perpendicular dimensions parallel to the surface and equal to a first lattice parameter, the first lattice parameter being a lattice parameter of the ternary or quaternary oxide as it is present at the surface; and (b) depositing a layer of a perovskite oxide on the ternary or quaternary oxide, the perovskite oxide being selected from perovskite oxides having an in-plane second lattice parameter, being a native lattice parameter, and being smaller than the first lattice parameter.

13. The method according to claim 12, wherein step (b) of depositing the layer of perovskite oxide is performed by molecular beam epitaxy or pulsed laser deposition.

14. The method according to claim 12, wherein step (a) comprises depositing a layer of the ternary or quaternary oxide on a semiconductor substrate by molecular beam epitaxy.

15. The method according to claim 14, wherein depositing the layer of the ternary or quaternary oxide on the semiconductor substrate comprises depositing the layer of ternary or quaternary oxide on a 2×1 reconstructed surface of the Si(001) or Ge(001) substrate.

* * * * *